United States Patent
Amaru et al.

(10) Patent No.: US 10,740,517 B1
(45) Date of Patent: Aug. 11, 2020

(54) INTEGRATED CIRCUIT (IC) OPTIMIZATION USING BOOLEAN RESYNTHESIS

(71) Applicant: Synopsys, Inc., Mountain View, CA (US)

(72) Inventors: Luca Gaetano Amaru, Santa Clara, CA (US); Patrick Vuillod, St. Bernard du Touvet (FR); Jiong Luo, Fremont, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 16/125,472

(22) Filed: Sep. 7, 2018

Related U.S. Application Data

(60) Provisional application No. 62/556,210, filed on Sep. 8, 2017.

(51) Int. Cl.
*G06F 30/327* (2020.01)

(52) U.S. Cl.
CPC .................................. *G06F 30/327* (2020.01)

(58) Field of Classification Search
CPC ............. G06F 17/5072; G06F 17/5077; G06F 17/505; G06F 17/5054; G06F 17/5068; G06F 17/5045; G06F 15/17381; G06F 2217/68; G06F 8/40; G06F 8/4452; G06F 8/452; G06F 9/52; G06F 2217/84; G06F 17/5022; G06F 17/5031; G06F 17/504; G06F 17/5059; G06F 2217/06; G06F 1/3203; G06F 1/3243; G06F 2217/70; G06F 21/79; G06F 21/86; G06F 2221/2129; G06F 12/0866; G06F 1/1626; G06F 2212/2022; G06F 3/12; G06F 15/00; G06F 7/57; G06F 9/226; G06F 9/265; G06F 9/30094; G06F 9/30101; G06F 9/3885; G06F 30/327; G06F 30/33; G06F 30/3323; G06F 3/14; G06F 9/545; H03K 19/00; H03K 19/0948; H03K 19/0966; H01L 2924/13091; H01L 23/576; H04N 5/235; H04N 5/378; G11C 16/22; G11C 11/56; G06T 1/20; G06K 1/121; G07F 7/12; H04Q 2011/0039; H04Q 2011/0041
USPC .................................................. 716/100–109
See application file for complete search history.

(56) References Cited

U.S. PATENT DOCUMENTS

| | | | |
|---|---|---|---|
| 2005/0183046 A1* | 8/2005 | Dougherty, Jr. | ...... G06F 30/327 716/104 |
| 2008/0276209 A1 | 11/2008 | Albrecht | |
| 2013/0019216 A1* | 1/2013 | Vasudevan | .......... G06F 30/3323 716/106 |

(Continued)

*Primary Examiner* — Binh C Tat
(74) *Attorney, Agent, or Firm* — Park, Vaughan, Fleming & Dowler LLP; Laxman Sahasrabuddhe

(57) ABSTRACT

Systems and techniques are described for circuit optimization using Boolean resynthesis. Features described in this disclosure include (i) a theory of Boolean filtering, to drastically reduce the number of gates processed and still retain all possible optimization opportunities, (ii) a weaker notion of maximum set of permissible functions, which can be computed efficiently via truth tables, (iii) a parallel package for truth table computation tailored to speedup Boolean methods, (iv) a generalized refactoring engine which supports multiple representation forms and (v) a Boolean resynthesis flow, which combines these techniques.

9 Claims, 8 Drawing Sheets

(56) References Cited

U.S. PATENT DOCUMENTS

| | | | |
|---|---|---|---|
| 2013/0339914 A1* | 12/2013 | Vrudhula | G06F 17/505 716/104 |
| 2014/0033161 A1 | 1/2014 | Mottaez | |
| 2016/0055270 A1* | 2/2016 | Chuang | G06F 17/505 716/104 |
| 2017/0177750 A1 | 6/2017 | Gaillardon | |

* cited by examiner

Input : Logic network $C$, Current node $n$
Output: Forward Functional Flexibility FFF$(C,n)$ 1 DC-truth-table$(n)$ = *logic constant* 1;
2 FFF$(C,n)$ = *logic constant* 1;
3 foreach *node* $m \in TFO(n)$ *in topological order* do
4     foreach *fanin $k$ of $m$* do
5         $i = 0$;
6         if $k$ *has DC info* then
7             DC-in$(i)$ = DC-truth-table$(n,k)$;
8         else
9             DC-in$(i)$ = *logic constant* 0;
10         $i$++;
11     end
12     SOP = get-sop-representation$(m)$;
13     DC-truth-table$(n,m)$ = *logic constant* 0;
14     acc-sop = *logic constant* 0;
15     foreach *term of the SOP* do
16         term = *logic constant* 1;
17         flex-term = *logic constant* 0;
18         foreach *literal of the term* do
19             flex-term = *dc-and*(literal, DC-in(literal-index), term, flex-term);
20             term = literal & term;
21         end
22         DC-truth-table$(n,m)$ = *dc-or*(term, flex-term, acc-sop, DC-truth-table$(n,m)$);
23         acc-sop = acc-sop | term;
24     end
25     if $m \in PrimaryOutputs(C)$ then
26         FFF$(C,n)$ = FFF$(C,n)$ & ! DC-truth-table$(n,m)$;
27 end
28 return FFF$(C,n)$;

FIG. 1

Input : Truth tables (a, dca, b, dcb)
Output: *dc-and*(a, dca, b, dcb)

1. aux1 = (a | dca) & dcb;
2. aux2 = (b | dcb) & dca;
3. res = aux1 | aux2;
4. return res;

FIG. 2

Input : Truth tables (a, dca, b, dcb)
Output: *dc-or*(a, dca, b, dcb)

1. aux1 = (! a & ! dca) & dcb;
2. aux2 = (! b & ! dcb) & dca;
3. res = aux1 | aux2;
4. return res;

FIG. 3

Input : Truth table $TT$ as concatenation of words, minterm $i$
Output: Value of the $i$-$th$ minterm 1. block = i / 64; *(integer division)*
2. blockbit = i % 64;
3. word = $TT$[block];
4. aux = word >> blockbit;
5. bit = aux % 2;
6. return bit;

FIG. 4

Input : Truth table of node $n$, primary input index $i$ and its truth $x$, polarity $p$
Output: Truth table of $n_{i=p}$ 1 if $i < 6$ then
2     if *p is positive polarity* then
3         foreach *block/word j of the TT* do
4             $n_{i=p}[j] = n[j]\ \&\ x[j]\ |\ ((n[j]\ \&\ x[j]) \gg 2^i)$;
5         end
6     else
7         foreach *block/word j of the TT* do
8             $n_{i=p}[j] = n[j]\ \&\ !x[j]\ |\ ((n[j]\ \&\ !x[j]) \ll 2^i)$;
9         end
10 else
11     ▷ here logic operations are block-wise
12     $k = 2^{i-6}$;
13     if *p is positive polarity* then
14         $g = n\ \&\ x$;
15         $h = g$ right-block-level-shift $k$;
16     else
17         $g = n\ \&\ !x$;
18         $h = g$ left-block-level-shift $k$;
19     $n_{i=p} = g\ |\ h$;
20 return $n_{i=p}$;

FIG. 5

Input  : Logic network, cut-size, filter-volume, nresub
        (nrsb), zero-gain (zg), max-candidates (mc)
Output: Resynthesized logic network

```
 1  list = topological-sort-network(network);
 2  foreach node m in list do
 3      if node is not a MFFC root then
 4          continue;
 5      cut = find-reconvergent-cut(m, cut-size);
 6      expand-cut-into-window(cut);
 7      if volume cut / size cut < filter-volume then
 8          continue;
 9      compute-truth-tables(window);
10      wdw = topological-sort-network(window);
11      foreach node n in wdw do
12          if (nrsb > -1) && zero-resub(n, window) then
13              continue;
14          if (nrsb > 0) && and-resub(n, wdw, zg, mc) then
15              continue;
16          if (nrsb > 1) && xor-resub(n, wdw, zg, mc) then
17              continue;
18          if (nrsb > 2) && ao-resub(n, wdw, zg, mc) then
19              continue;
20          if (nrsb > 3) && xa-resub(n, wdw, zg, mc) then
21              continue;
22          if (nrsb > 4) && ax-resub(n, wdw, zg, mc) then
23              continue;
24          if (nrsb > 5) && mux-resub(n, wdw, zg, mc) then
25              continue;
26          if (nrsb > 6) && mx-resub(n, wdw, zg, mc) then
27              continue;
28      end
29  end
30  network-cleanup-and-sweeping(network);
```

FIG. 6A

```
Input  : Logic network, cut-size, filter-volume, nresub,
         zero-gain, max-candidates
Output: Resynthesized logic network using FFF
        information
 1 list = topological-sort-network(network);
 2 foreach node m in list do
 3     if node is not a MFFC root then
 4         continue;
 5     cut = find-reconvergent-cut(m, cut-size);
 6     expand-cut-into-window(cut);
 7     if volume cut / size cut < filter-volume then
 8         continue;
 9     compute-truth-tables(window);
10     wdw = topological-sort-network(window);
11     foreach node n in wdw do
12         FFF = compute-FFF(n, wdw);
13         update-truth-table-with-flexibility(n, FF);
14         run-resub-flow();
15         if resub with FFF is successful then
16             break;
17     end
18 end
19 network-cleanup-and-sweeping(network);
```

FIG. 7A

# INTEGRATED CIRCUIT (IC) OPTIMIZATION USING BOOLEAN RESYNTHESIS

RELATED APPLICATION

This application claims benefit of U.S. Provisional Application Ser. No. 62/556,210, filed on 8 Sep. 2017, by the same inventors, the contents of which are herein incorporated by reference in their entirety for all purposes.

BACKGROUND

Technical Field

This disclosure relates to integrated circuit (IC) optimization. More specifically, this disclosure relates to IC optimization using Boolean resynthesis.

Related Art

Advances in process technology and an almost unlimited appetite for electronics have fueled a rapid increase in the size and complexity of IC designs. Boolean resynthesis techniques are increasingly being used in electronic design automation to improve quality of results where algebraic methods hit local minima. Boolean methods rely on complete functional properties of a logic circuit, eventually including don't cares. In order to gather such properties, computationally expensive engines are required, e.g., truth tables, SAT and BDDs, which in turn limit the scalability of Boolean resynthesis.

Therefore, what are needed are techniques and systems for circuit optimization using Boolean resynthesis without the above-described drawbacks.

SUMMARY

Some embodiments described herein provide techniques and systems for circuit optimization using Boolean resynthesis. Specifically, this disclosure presents improvements to Boolean resynthesis, enabling more optimization opportunities to be found at the same, or smaller, runtime cost than existing methods. Features described in this disclosure include (i) a theory of Boolean filtering, to drastically reduce the number of gates processed and still retain all possible optimization opportunities, (ii) a weaker notion of maximum set of permissible functions, which can be computed efficiently via truth tables, (iii) a parallel package for truth table computation tailored to speedup Boolean methods, (iv) a generalized refactoring engine which supports multiple representation forms and (v) a practical Boolean resynthesis flow, which combines these techniques.

Using the Boolean resynthesis techniques described herein on the EPFL benchmarks (see L. Amaru, P.-E. Gaillardon, G. De Micheli, "The EPFL Combinational Benchmark Suite" International Workshop on Logic & Synthesis (IWLS), 2015), we improve eight of the best known area results in the synthesis competition.

During operation, some embodiments optimize a logic network in an IC design by sorting nodes of the logic network in topological order to obtain a sorted list of nodes. Next, for each node in the sorted list of nodes that is a root of a maximum fanout-free cone, the embodiments perform the following steps: (a) determine a reconvergent cut based on the node; (b) expand the reconvergent cut to obtain a window of the logic network; (c) determine a metric that indicates how beneficial resubstitution is expected to be on the window; (d) compare the metric with a threshold; and (e) in response to determining that the window is expected to benefit from resubstitution, (1) compute truth-tables for the window, and (2) for each node in the window, apply a resubstitution flow.

In some embodiments, expanding the reconvergent cut to obtain the window of the logic network comprises adding every external node to the reconvergent cut that is not contained in the reconvergent cut, but has fanins inside the reconvergent cut.

In some embodiments, determining the metric that indicates how beneficial resubstitution is expected to be on the window comprises dividing a volume of the window by an input size of the window.

In some embodiments, in response to determining that the window is expected to benefit from resubstitution, the embodiments update the truth-tables using forward functional flexibility (FFF) values.

BRIEF DESCRIPTION OF THE FIGURES

FIG. 1 illustrates a process to compute FFF(C, n) in accordance with some embodiments described herein.

FIG. 2 illustrates a "dc-and" operation which is an AND-2 function including don't cares for each operand in accordance with some embodiments described herein.

FIG. 3 illustrates a "dc-or" operation which is an OR-2 function including don't cares for each operand in accordance with some embodiments described herein.

FIG. 4 illustrates a constant-time procedure for checking if the i-th minterm of a truth table is on in accordance with some embodiments described herein.

FIG. 5 illustrates a process for cofactoring with truth tables in accordance with some embodiments described herein.

FIG. 6A illustrates an enhanced resubstitution process, capable of inferring complex gates, mapped or unmapped, with efficient runtime in accordance with some embodiments described herein.

FIG. 7A illustrates a procedure for resubstitution with FFF in accordance with some embodiments described herein.

DETAILED DESCRIPTION

Figure 6B:
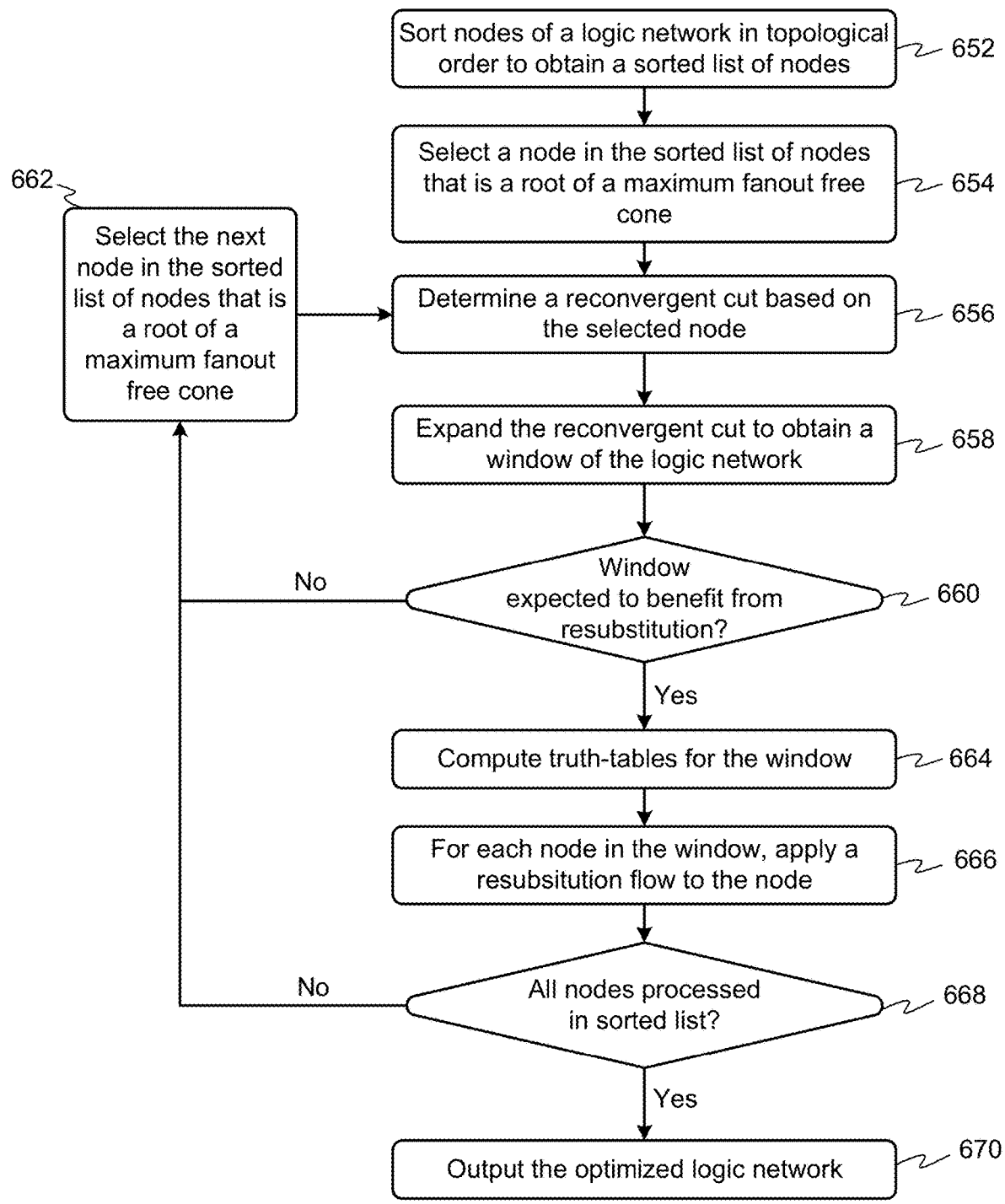
FIG. 6B illustrates an enhanced resubstitution process in accordance with some embodiments described herein.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Overview of IC Design and Manufacturing

An IC design and manufacturing process produces IC chips. IC design software tools can be used to create an IC design. Once the IC design is finalized, it can undergo fabrication, packaging, and assembly to produce IC chips. The overall IC design and manufacturing process can involve multiple entities, e.g., one company may create the software for designing ICs, another company may use the software to create the IC design, and yet another company may manufacture IC chips based on the IC design. An IC design flow can include multiple steps, and each step can involve using one or more IC design software tools. An improvement to one or more of these steps in the IC design flow results in an improvement to the overall IC design and manufacturing process. Specifically, the improved IC design and manufacturing process can produce IC chips with a shorter time-to-market (TTM) and/or higher quality of results (QoR).

An IC design can be represented by using different data formats or languages as the IC design progresses through an IC design flow, wherein the different data formats or languages represent the IC design at different levels of abstraction. In general, higher levels of abstraction contain fewer details of the IC design than lower levels of abstraction. Typically, the IC design is described at a high level of abstraction in the early stages of the IC design flow, and the level of abstraction becomes progressively lower as the IC design moves through the IC design flow (the description of the IC design becomes more specific as the IC design progresses through the IC design flow).

For example, toward the beginning of the IC design flow, an IC design can be described at a high level of abstraction by using a hardware description language (HDL) which describes the functionality of the IC design but does not provide any information about the actual geometric shapes that will be printed on the wafer. Toward the end of the IC design flow, the same IC design can be represented in a low level of abstraction by using a data format or language such as GDSII or OASIS, which contains a description of the actual geometric shapes that are to be printed on the wafer. In between the two ends of the IC design flow, the IC design may be represented in numerous data formats or languages that describe the same IC design at different levels of abstraction.

Some examples of IC design steps and the associated software tools are described below. These examples are for illustrative purposes only and are not intended to limit the embodiments to the forms disclosed. This disclosure describes embodiments that can be used in one or more IC design steps.

IC design software tools enable IC designers to describe the functionality that the IC designers want to implement. These tools also enable IC designers to perform what-if planning to refine functionality, check costs, etc. During logic design and functional verification, the HDL, e.g., SystemVerilog, code can be written and the design can be checked for functional accuracy, e.g., the design can be checked to ensure that it produces the correct outputs.

During synthesis and design for test, the HDL code can be translated to a netlist using one or more IC design software tools. Further, the netlist can be optimized for the target technology, and tests can be designed and implemented to check the finished chips. During netlist verification, the netlist can be checked for compliance with timing constraints and for correspondence (i.e., equivalence checking) with the RTL design and/or HDL code.

During design planning, an overall floorplan for the chip can be constructed and analyzed for timing and top-level routing. During physical implementation, circuit elements can be positioned in the layout and can be electrically connected.

During analysis and extraction, the IC design's functionality can be verified at a transistor level and parasitics can be extracted. During physical verification, the design can be checked to ensure correctness for manufacturing, electrical issues, lithographic issues, and circuitry.

During resolution enhancement, geometric manipulations can be performed on the layout to improve manufacturability of the design. During mask data preparation, the design can be "taped-out" to produce masks which are used during fabrication.

Overview of Optimization Using Boolean Resynthesis

Boolean resynthesis aims at improving an existing logic network implementation. The methods used in Boolean resynthesis are capable of stronger optimization than algebraic techniques, which usually generate the initial logic network implementation in an EDA flow. However, Boolean methods have higher computational complexity than algebraic methods, thus they are used cautiously in EDA flows.

This disclosure presents improvements to Boolean resynthesis. We revisit fundamental data structures and algorithms for Boolean resynthesis, in light of modern computing capabilities, enabling more optimization opportunities to be found at the same, or smaller, runtime complexity than state-of-the-art methods. Embodiments described in this disclosure contain one or more of the following features:

- A theory of Boolean filtering, to drastically reduce the number of gates processed by resubstitution methods, and still retain all possible optimization opportunities.
- A weaker notion of maximum set of permissible functions, called forward functional flexibility, which can be computed efficiently via truth tables,
- A parallel package for truth table computation tailored to speedup Boolean methods. Other than truth tables, important properties can be computed and stored with the same package, e.g., functional support and structural dependencies.
- A generalized refactoring engine which supports multiple representation forms and maximizes nodes sharing.
- A practical Boolean resynthesis flow, which combines the techniques proposed so far into a global optimization engine—for use in commercial EDA tools.

The above-described techniques were tested on the EPFL benchmarks. By applying Boolean resynthesis directly on the LUT-6 mapped networks, we improved eight of the best known area results in the EPFL synthesis competition. We embedded the Boolean resynthesis engine in a commercial EDA tool. After physical implementation, our enhanced EDA flow reduces the area by 2.67%, leakage by 2.11%, worst negative slack by 0.44% and total negative slack by 5.48%, at negligible runtime cost.

Boolean Logic Optimization

Logic optimization methods are usually divided into two groups: Algebraic methods, which are fast, and Boolean methods, which are slower but achieve better results. Traditional algebraic methods treat a logic functions as a polynomial. Instead, Boolean methods handle the true nature of a logic function using Boolean identities as well as don't cares to get a better solution.

While many different Boolean methods exist, this disclosure focuses on resubstitution, rewriting, refactoring and permissible functions, because they show the best QoR/runtime tradeoff in an industrial synthesis environment. An exhaustive review on the literature for Boolean methods can be found in (1) R. K. Brayton, G. D. Hachtel, A. L.

Sangiovanni-Vincentelli, "Multilevel logic synthesis", Proc. IEEE 78.2 (1990): 264-300, (2) G. De Micheli, "Synthesis and Optimization of Digital Circuits", McGraw-Hill, New York, 1994, and (3) Khatri, Sunil P., and Kanupriya Gulati. Advanced techniques in logic synthesis, optimizations and applications. Springer, 2011. The contents of these three documents are herein incorporated by reference in their entirety to provide a background on Boolean methods.

Resubstitution (re)expresses the function of a node using other nodes already present in the network. The transformation is accepted if the new implementation of the node is better, w.r.t. a target metric, than its current implementation using the immediate fanins. This approach generalizes to k-resubstitution, which adds exactly k new nodes and reduces the size if the node's Maximum Fanout-Free Cone (MFFC) has at least k+1 nodes. The functionality of the new nodes can be drawn from a library of available primitive gates for resub. This approach is similar to technology-dependent resynthesis based on resubstitution. In its And Inverter Graph (AIG) implementation, resubstitution only adds AND-2 type of new nodes, with eventually complemented inputs. The MFFC for a node n is defined as the maximum set of nodes where each node in the MFFC is either (1) n itself, or (2) in the transitive fanin of n and the node's fanout is completely contained in the MFFC. Further details can be found in (1) A. Mishchenko, S. Chatterjee, R. Brayton, "DAG-aware AIG rewriting a fresh look at combinational logic synthesis," Proc. DAC 2006, and (2) A. Mishchenko and R. K. Brayton, "Scalable logic synthesis using a simple circuit structure", Proc. IWLS '06, pp. 15-22. The contents of these two documents are herein incorporated by reference in their entirety to provide details of MFFC and AIG.

Rewriting is a greedy algorithm which minimizes the size (and/or depth) of a logic network by iteratively selecting network subgraphs rooted at a node and replacing them with smaller pre-computed subgraphs, while preserving the functionality of the root node. Typical pre-computed subgraphs cover all 4 variables functions, or more efficiently their 222 NPN classes, in their optimal circuit realizations.

Refactoring can be seen as a variant of rewriting. It iteratively selects large cones of logic rooted at a node. Then, it tries to replace the logic structure of the cone by a factored form of the root function. The change is accepted if there is an improvement in the selected cost metric (usually number of gates in the network).

Very frequently, the function at a node can be changed without affecting the function at the primary outputs. This relates to the observability don't cares of a logic network. In this scenario, a permissible function at a node is one—of the possibly many—logic functions which can be assumed by the node while still preserving the intended behavior at the primary outputs. A collection of permissible functions is known as a set of permissible functions, of which two special forms are the maximum set of permissible functions and compatible set of permissible functions. As the name suggests, the Maximum Set of Permissible Functions (MSPF) of a node in a logic network is the set that contains all possible permissible functions of the node. As the MSPF of a node contains the largest set of permissible functions associated with it, this set also contains the largest observability don't care set for the node. A compatible set of permissible functions is a subset of the MSPF and is computed based on some ordering of the connections in the logic network.

Boolean optimization methods are known in the industry to be powerful but runtime expensive. This limits their wide applicability in automated design, thus potentially leaving optimization opportunities unseen. Some embodiments described herein spot more Boolean optimization opportunities, without spending more runtime, thanks to a revisitation of fundamental data structures and algorithms in Boolean resynthesis. The following paragraphs describe approaches for the fast exploration of the Boolean optimization search space. First, a theory of Boolean filtering is presented, which aims at strongly reducing the number of candidates for resubstitution, without losing any optimization opportunity. Next, a weaker notion of MSPF is discussed, that can be efficiently obtained via truth tables, and details its main computation steps. Then, a parallel package is described for truth table computation, which can be extended to extract functional support and structural dependencies in a logic network.

Boolean Filtering

In principle, k-resubstitution can produce optimal logic networks, with k large enough. Unfortunately, k-resubstitution suffers from high computational complexity, limitation which becomes apparent already for k=1. In order to study the complexity of resubstitution in practice, let us consider a typical execution scenario for resub.

Resub is usually applied to small/medium windows of logic, say up to 15-20 inputs, rather than to the global logic network. For such windows, truth tables (up to 15 inputs), or BDDs (up to 20 inputs), for each node are computed quickly. These data structures efficiently support functional equivalence checks for individual resub moves. For our runtime analysis purposes, equivalence checks are the primitive operations in the resub algorithm. Consider now 1-resubstitution, where the library of primitive operations for resub consists only of AND-2 connectives. If we have N internal nodes in the window, resub would try to express each one of these N nodes, with MFFC>1, as a new AND-2 of two other nodes in the window. So, in the worst case, $O(N^2)$ equivalence checks are needed for each node, which sums up to $O(N^3)$ equivalence checks for the whole window. More structural filtering can be applied, e.g., skip candidates in the Transitive Fan-Out (TFO) of the current node, skip disjoint trees, skip nodes whose level is too far away, etc. Even with all structural filters, the perceived runtime complexity remains very high, which requires to set a maximum number of candidates to be tried, m, at least for the first new input. In this way, the overall complexity decreases to $O(mN^2)$ equivalence checks. Experimentally, it is known that by setting a maximum number of candidates we overlook many advantageous optimization opportunities, but this becomes even more necessary when attempting resubstitution with higher order k or richer resub-libraries. Despite the speedups above, many equivalence checks are still spent in verifying null candidates, i.e., nodes that cannot possibly lead to a valid resub solution. In this disclosure, we address the filtering problem in resub from a different perspective. Rather than filtering based on structural properties, we aim at filtering candidates based on functional properties, i.e., we want to try only candidates that are guaranteed to lead to a functionally valid solution. We propose a theory of Boolean filtering, in the form of a list of rules that addresses exactly this problem. Let us call f the function of the current node we are trying to resub. We support resub moves with up to 3 inputs, as they cover the most common gates in today's libraries. Let us call a, b and c the functions of the new input candidates, in order from the outer loop (a) to the inner loop (c) of equivalence checks. For 2 inputs resub moves we only filter "a" candidates, while for 3 inputs resub we filter both "a" and "b" candidates. The last input, either "b" or "c," is automatically filtered by the final equivalence check. In general, the most effective candidate to filter is "a," as it reduces the outer loop iterations.

Functional filtering is carried over via canonical truth tables, or BDDs, as they are already available for all nodes in the window. We provide the following rules to functionally filter candidates for 10 different types of resub:

and resub: $f=a \cdot b$.
   a is valid, if and only if, $f \cdot a = f$.
or resub: $f=a+b$.
   a is valid, if and only if, $f+a=f$.
xor resub: $f=a \oplus b$.
   a is always valid if $b=f \oplus a$ exists.
   this can be extended to and-xor, or-xor resub.
and-or resub (ao): $f=a+b \cdot c$.
   a is filtered with or rules above.
   $g=a' \cdot f=a' \cdot a+a' \cdot b \cdot c=a' \cdot b \cdot c$
   b is valid, if and only if, $g \cdot b = g$
or-and resub (oa): $f=a \cdot (b+c)$.
   a is filtered with and rules above.
   $g=a'+f=a'+a \cdot b+a \cdot c=a'+b+c$
   b is valid, if and only if, $g+b=g$
xor-and resub (xa): $f=a \cdot (b \oplus c)$.
   a is filtered with and rules above.
   b is valid, if and only if, $f \cdot b \neq 0$ and $f \cdot b' \neq 0$.
xor-or resub (xo): $f=a+(b \oplus c)$.
   a is filtered with or rules above.
   $g=a' \cdot f=a' \cdot (b \oplus c)$
   b is valid, if and only if, $g \cdot b \neq 0$ and $g \cdot b' \neq 0$
mux resub: $f=(a \cdot b)+(a' \cdot c)$:
   $g=a \cdot f$
   $h=a' \cdot f$
   a is valid, if and only if, $g \neq 0$ and $h \neq 0$
   b is valid, if and only if, $g \cdot b = g$
   c is valid, if and only if, $h \cdot c = h$ Note that the rules above can be easily extended to deal with input/output complementation for f, a, b and c. The above-described Boolean filtering allows logic synthesis to spend runtime only on profitable transformations, skipping unfruitful attempts. For example, considering the voter bench-mark of the EPFL suite, ABC command resub—K 10-N 1 takes about 0.09 seconds and reduces the size by about 14%. Increasing N to 2 and 3, which corresponds to 2 and 3 resub, improves the size savings to 16% and 20% for 0.13 and 0.21 seconds spent, respectively. On the other hand, our proposed resub with Boolean filtering, using the same cut size of 10, is able to reduce the original size by 26% in 0.1 seconds. Our size improvement is measured after AIG strashing, which decomposes our complex resub types, for the sake of fair comparison with ABC resub.

Weaker Notion of MSPF

The MSPF of a node, or gate, in a logic network is the set that contains all possible permissible functions of the node. Unfortunately, the computation of MSPF can be time-consuming, especially when a logic network has many reconvergent gates. In addition, the MSPFs of all the gates and connections in a circuit have to be recomputed each time the circuit is transformed and reduced. Further details on MSPF can be found in (1) S. Muroga, *Logic Synthesizers, The Transduction Method and Its Extension, Sylon Logic Synthesis and Optimization*. Springer US, 1993. 59-86, and (2) S. Muroga, et al. "The transduction method-design of logic networks based on permissible functions", IEEE Transactions on Computers 38.10 (1989): 1404-1424. The contents of these two documents are herein incorporated by reference in their entirety to provide details on MSPF.

To exploit the concept of permissible functions with affordable runtime, we present a weaker notion of MSPF, that we call Forward Functional Flexibility (FFF) of the logic network w.r.t. a node. The main difference between FFF and MSPF stands in the scope of computation of the permissible functions. FFF considers only the permissible functions generated by the forward propagation of a node's functionality and don't cares to its TFO. On the other hand, MSPF considers all possible permissible functions by definition, thus also the ones originated by the interaction of a node with its Transitive Fan-In (TFI) and the rest of the network. Our experience indicates that FFF grasps a good amount of the MSPF opportunities while still fitting with a tight runtime budget.

Even though the following analysis considers generic logic networks, please note that FFF is efficiently computed only for small/medium windows. The FFF is computed as a second truth table (or any other canonical representation, e.g., BDD) for a specific node in the network. We refer to this second truth table as FFF(C, n), where C is the logic network, or window, and n is the node considered. The FFF(C, n) information can be interpreted as follows: where its entry is "1", the corresponding entry in the real truth table of n can be flipped without effect on the primary outputs of C. This information has great value to Boolean methods: when evaluating the validity of a transformation, e.g., resubstitution, the goal is not anymore to match the functionality of the truth table of n, say TTnew(n)=TT(n), but it is then sufficient to match (TTnew(n) & !FFF(C; n))=(TT(n) & !FFF(C; n)). The theory of Boolean filtering previously presented can be extended to include forward functional flexibility information during its rules computation.

FIG. 1 illustrates a process to compute FFF(C, n) in accordance with some embodiments described herein. The pseudocode shown in FIG. 1 is self-explanatory. Specifically, the procedure illustrated in FIG. 1 begins by assigning maximum flexibility to the global FFF(C, n) (logic constant 1). The local don't care (DC) truth table for n is also set to logic constant 1. In the context of FIG. 1, the DC-truth-table for a generic node m w.r.t. n has a different meaning than the FFF. In order to explain this, let us focus on the i-th entry of the tables. If DC-truth-table(n, m)[i] is "0", it means that the truth-table(m)[i] is not sensible ("does not care") to local bit-flipping of truth-table(n)[i] propagated through the TFO (n).

In FIG. 1, the DC-truth-table is propagated from n to the primary outputs in topological order. For each node, the DC-truth-table is computed by processing the node's Sum-Of-Products (SOP) representations. Note that while parsing the SOP, and/or operators are replaced by special operators (which are described below in reference to FIG. 2 and FIG. 3) that take into consideration the local don't cares.

FIG. 2 illustrates a "dc-and" operation which is an AND-2 function including don't cares for each operand in accordance with some embodiments described herein. FIG. 3 illustrates a "dc-or" operation which is an OR-2 function including don't cares for each operand in accordance with some embodiments described herein. The pseudocode shown in FIGS. 2 and 3 for the "dc-and" and "dc-or" operators is self-explanatory.

When a primary output m is found during the procedure, FFF(C, n) is updated by and-ing itself with the complement of DC-truth-table(n, m). It can be seen that DC-truth-table(n, m) and FFF(C, n) have complementary meanings. Moreover, only the common intersection between the FFF of all outputs can be safely used for optimization purposes, which explains the and-ing. Once all the primary outputs have been processed, the final functional flexibility FF(C, n) is returned by the procedure illustrated in FIG. 1.

Parallel Truth Table Package

When dealing with small windows/networks, say up to 15 primary inputs, functional properties of nodes can be efficiently computed via truth tables. The key insight to make a truth table package efficient, is to represent a whole truth table as union of blocks, where each block fits into a word, e.g., 64-bits. In this way, each block represents a truth table with $\log_2$ (word-size)-inputs, e.g., 6-inputs. Bitwise logic operations between words, such as AND, OR, XOR and NOT, are typically performed by ALUs in a single clock cycle.

Without loss of generality, we will continue our analysis assuming word-size of 64 bits. In this scenario, a 10-inputs truth table requires 16 words, i.e., 1024 bits.

Most truth table operations do not imply interdependency between words, so they can be conveniently parallelized. However, one complication deriving by encoding a truth table as concatenation of words rather than a simple vector, stands in the access of individual bits. Let us assume we want to check if the i-th minterm of a truth table is on. We first need to select the right block/word where the minterm is stored, and then use bit-level operations to retrieve the minterm value out of its word.

FIG. 4 illustrates a constant-time procedure for checking if the i-th minterm of a truth table is on in accordance with some embodiments described herein. The pseudocode illustrated in FIG. 4 is self-explanatory, and it can be easily noted that the computation complexity this procedure does not depend on the size of the truth table, thus the constant-time property.

With such a parallel truth table package, computation of truth tables is not achieved via traditional simulation, but by direct computation of nodes' functions, in topological order. Indeed, the truth tables of the primary inputs are known a priori. Then, a truth table for a generic node can be obtained by computing its SOP, in terms of primitive bitwise logic operations between blocks/words of the immediate fanins.

Computing functional support during truth table construction: in logic synthesis, knowing the functional support of internal nodes is highly beneficial. The functional support of a node says which primary inputs the node depends on. It can happen that, due to reconvergence ("reconvergence" means when multiple paths from the output of a node meet again, i.e., reconverge, before reaching the primary outputs) in the logic network, a node has a path connecting to a primary input, but its functionality does not really depend on it. This information is useful to simplify the logic network, e.g., remove redundant connections, and enhance the efficacy of other optimization methods. For example, during resubstitution, knowing the functional support of a node can speed up further the evaluation of candidates. If a new fanin candidate "a" has completely disjoint support w.r.t. the target node n, it can be skipped because no advantageous resub move will be found. Similar considerations can be derived on the minimum intersection between the functional support of node candidates vs. target node. Indeed, comparing the functional support of nodes is much faster than running Boolean filtering rules on the whole truth tables. For this reason, checks on the functional support are run before Boolean filtering rules.

The functional support information of a node n can be stored in a small additional truth table, say FS(n), using one-hot encoding. Each entry of FS(n) is associated to a primary input. If an entry of FS(n) is "1", then node n depends on the associated primary input. Otherwise, if an entry of FS(n) is "0", then node n does not depend on the associated primary input. The length of FS(n) equals the number of primary inputs. With the current limits on truth table storing & computation, FS(n) will always fit in one 64-bit word.

At the same time of truth table construction, it is possible to compute FS(n) too. First, for each primary input, say i, FS(i) has only the i-th bit on, while the rest is zero. As long as we are exploring a disjoint tree of logic and a node n contained by it, $$FS(n) = \sum_{j=1}^{nfanin} FS(\text{get-fanin}(n, j)).$$

Instead, if node n is part of a logic network with reconvergence, we use a formal definition of functional support: n depends on primary input i if and only if $n_{i=0} \neq n_{i=1}$. Thus, FS(n) computation reduces to cofactoring with truth tables.

FIG. 5 illustrates a process for cofactoring with truth tables in accordance with some embodiments described herein. The pseudocode shown in FIG. 5 is self-explanatory.

Storing structural dependencies information as truth table: for applications where cofactoring is too expensive, in terms of runtime, the functional support information can be approximated by structural dependencies. Structural dependencies (SD(n)) follow the same principles as before, but now also for the cases where node n is part of a reconvergent portion of logic, SD(n) is still computed as $$SD(n) = \sum_{j=1}^{nfanin} SD(\text{get-fanin}(n, j)).$$

If the network/window is small enough, i.e., has less than one thousand gates, it is feasible to extend SD to have an entry for each gate, and get more detailed structural dependency information. With this extension, SD information becomes complementary to FS. Indeed, the extended SD can be used to quickly verify TFI/TFO inclusions, which are runtime expensive checks if run alone.

Global Boolean Resynthesis Flow

This section presents new Boolean optimization techniques, based on the theoretical and practical improvements described so far, which together form a global Boolean resynthesis flow.

FIG. 6A illustrates an enhanced resubstitution process, capable of inferring complex gates, mapped or unmapped, with efficient runtime in accordance with some embodiments described herein.

The pseudocode illustrated in FIG. 6A is self-explanatory. Specifically, the top procedure (line 1 in FIG. 6A) spans through the entire logic network, considering each node in topological order, but resubstitution is only applied to small/medium windows created around a node. The window computation proceeds as follows. First a reconvergent cut is found for the current node (line 5 in FIG. 6A). Then, the cut is expanded w.r.t. its boundaries (line 6 in FIG. 6A), i.e., every external node which is not contained by the cut, but has fanins inside the cut, is added. This process is continued until (i) no more nodes can be added or (ii) a volume limit is hit. The final result is a window, with as many inputs as leaves in the original cut but more outputs, due to the expansion. Resubstitution is then applied to this window (lines 11-28 in FIG. 6A). Windows that are too thin, i.e., with volume over input size ratio too small, are filtered because they are unlikely to lead to any advantageous resubstitution. Only windows passing the filtering tests move to truth table computation. Truth tables, functional support, and related properties, are calculated for every node in the window, using the framework described above. At this point, each node of the window is tried for various resubstitutions, in a waterfall model, i.e., the first resubstitution succeeding is the one kept. The variable "nresub" in FIG. 6A determines how many different types of resub are tried, and thus controls the computational complexity of the algorithm. Without loss of generality, we assume nresub is set to max-int so all types of resub are tried. First, zero-resub is tried, where only equivalent gates in the window are merged, up to complementation. Functional support information can drastically speedup zero-resub: only candidates with exactly the same support as n are tried. If zero-resub returns 1, i.e., was successful, no other resubs are attempted for the same node and the loop moves to the next node in the window. Otherwise, other types of resub are tried. For each of these other resub, the size of the MFFC rooted at n is checked: if extra-resub-nodes MFFC-size+zero-gain the loop moves directly to the next node, because no size savings are possible. For example, and-resub introduces 1 extra node and the MFFC-size of n needs to be at least 2 to have advantageous resub. This costing can be extended to reduce the number of levels. More importantly, this costing can be made more accurate if the logic network is mapped, so real area savings can be measured in place of node savings. Inside each of the resub type, the filtering rules described above are used to evaluate only candidates leading to valid resubstitutions. Also, a maximum number of candidates is still used, even though rarely hit, to keep runtime under control for corner cases. The types of supported resub, in increasing computational complexity order, are: and (and-2 node/gate), xor (xor-2 node/-gate), ao (and-or nodes/gates), xa (xor-and nodes/gates), ax (and-xor nodes/gates), mux (mux node/gate) and mx (mux-xor nodes/gates). If the regular polarity resub is not immediately successful, complementation at inputs and output of each resub is also tried. Finally, dead nodes cleanup and logic network sweeping is performed (line 30 in FIG. 6A).

The forward functional flexibility information described above is particularly useful in the resub environment. It can be used to update the truth table information for the current node n in the window, so successive resub moves can take advantage of the don't cares flexibility.

FIG. 6B illustrates an enhanced resubstitution process in accordance with some embodiments described herein. The process can begin by sorting nodes of a logic network in topological order to obtain a sorted list of nodes (step 652). Next, the process can select a node in the sorted list of nodes that is a root of a maximum fanout free cone (step 654). The process can then determine a reconvergent cut based on the selected node (step 656). A cut corresponds to a boundary that separates a node from the primary inputs of the logic network. The term "cut" refers to a portion of the node's transitive fanin cone, wherein the boundary nodes are the leaves, and the node is the root. A reconvergent cut is a cut that includes reconvergent paths.

Next, the process can expand the reconvergent cut to obtain a window of the logic network (step 658). The process can then determine whether or not the window is expected to benefit from resubstitution (step 660). If the window is not expected to benefit from resubstitution ("No" branch), then the process can select the next node in the sorted list of nodes that is a root of a maximum fanout free cone (step 662). On the other hand, if the window is expected to benefit from resubstitution ("Yes" branch), then the process can compute truth-tables for the window (step 664). Next, for each node in the window, the process can apply a resubstitution flow to the node (step 666). In step 668, the process can check if all nodes in the sorted list have been processed. If so ("Yes" branch), the process can output the optimized logic network (step 670). Otherwise ("No" branch), the process can return to step 662 and select the next node in the sorted list of nodes that is a root of a maximum fanout free cone.

In step 660, the process can determine a metric that indicates how beneficial resubstitution is expected to be on the window, and then compare the metric with a threshold to determine whether or not resubstitution should be performed. Specifically, the metric can be computed by dividing a volume of the window by an input size of the window. In some embodiments, the volume of the window proportional to the number of nodes in the window, and the input size of the window is equal to the number of inputs of the window.

FIG. 7A illustrates a procedure for resub with FFF in accordance with some embodiments described herein. The pseudocode illustrated in FIG. 7A is self-explanatory. Most of the procedure illustrated in FIG. 7A remains identical to the one illustrated in FIG. 6A, but with updates inside the window processing. For each node n evaluated inside the window, the FFF information is computed and the truth table for n is updated. If the successive resub is successful, no other nodes are tried and we skip to next window. This is necessary because the truth tables may be modified by the use of don't cares, so new resub moves are potentially functionally incorrect.

Figure 7B:
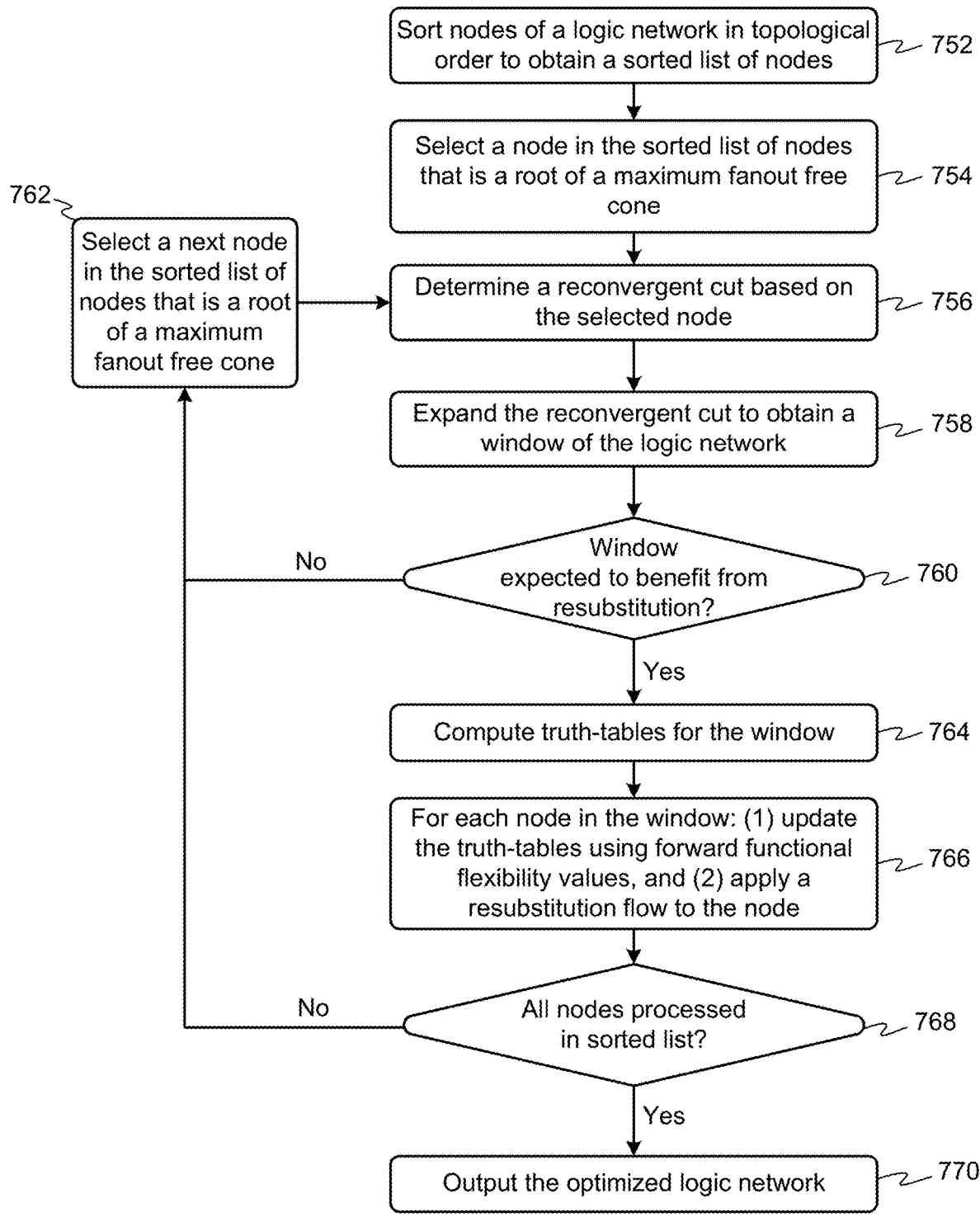
FIG. 7B illustrates a procedure for resubstitution with FFF in accordance with some embodiments described herein.

FIG. 7B illustrates a procedure for resubstitution with FFF in accordance with some embodiments described herein. The process can begin by sorting nodes of a logic network in topological order to obtain a sorted list of nodes (step 752). Next, the process can select a node in the sorted list of nodes that is a root of a maximum fanout free cone (step 754). The process can then determine a reconvergent cut based on the selected node (step 756). Next, the process can expand the reconvergent cut to obtain a window of the logic network (step 758). The process can then determine whether or not the window is expected to benefit from resubstitution (step 760). If the window is not expected to benefit from resubstitution ("No" branch), then the process can select the next node in the sorted list of nodes that is a root of a maximum fanout free cone (step 762). On the other hand, if the window is expected to benefit from resubstitution ("Yes" branch), then the process can compute truth-tables for the window (step 764). Next, for each node in the window, the process can (1) update the truth-tables using forward functional flexibility values, and (2) apply a resubstitution flow to the node (step 766). In step 768, the process can check if all nodes in the sorted list have been processed. If so ("Yes" branch), the process can output the optimized logic network (step 770). Otherwise ("No" branch), the process can return to step 762 and select the next node in the sorted list of nodes that is a root of a maximum fanout free cone.

Refactoring aims at re-expressing a cut, or a window, with a new, potentially more compact, logic structure. The change is accepted if there is an improvement in the target cost metric (area, delay, etc.). Refactoring differs from resubstitution in the scope of the structural change: while resub changes one node at a time, refactoring operates on a large cone of logic at once. Compared to rewriting, refactoring supports larger cuts and can operate on multi-output functions (windows).

Standard refactoring is based on SOP representation, and thus uses traditional collapsing, minimization and refactoring algorithms. As many new representation forms emerge in EDA, and offer advantages over SOP, we developed a generalized refactoring engine which can support generic data structures & optimization techniques. We call it Window Export & Import (WEI) package. WEI is applied node-wise, and works as follows. For the given node n, it computes a cut using reconvergence driven methods. The cut can be extended into a window, using a similar approach to the one described for resub. Then, a new logic network is created, named weiNet, which duplicates the logic of the window. Each leaf of the window/cut becomes a primary input of weiNet. Each node of the window, which is not a PI, and has at least one fanout outside of the window itself becomes a primary output of weiNet. At this point, a generic synthesis technique can be applied to weiNet. After weiNet is synthesized, its characteristics are measured. If an improvement is seen in the chosen metric, weiNet is imported back to the original network. Because of the way weiNet is built, sharing of the logic below each POs is enforced and maximized, so no unexpected duplication needs to be applied when importing weiNet back to the original network.

Some beneficial synthesis techniques that we have experimented on weiNet, with small/medium sizes, are: SOP collapsing and factoring, ESOP collapsing and XOR-decomposition, BDD collapsing and dominator-based decomposition, BBDD restructuring for XORs, SPP collapsing and minimization, and others. In general, WEI enables high-effort optimization methods to run on small sub-networks, with guaranteed maximal sharing of nodes and contained computational complexity.

We have integrated the optimization techniques presented so far in an industrial logic optimization engine, together with well known state-of-the-art methods. Then, we created a Boolean resynthesis script, consisting of the following commands:

rw; rs -c 9; rs -c 10; rfs -c 9;
rwz; mf -c 9; rsz -c 10; rw;
rfb -c 12; rs -c 9; rfs -c 10;
rs -c 10; rw; rs -c 12; rsz -c 12;
rwz; rfs -c 10; mf-c 10;
rs -c 12; rfbz -c 14; mf -c 11; rwz Where "rw" is state-of-the-art rewriting and balancing, "rs" is resub for complex gates, "mf" is resub with FFF information, "rfs" is generalized refactoring based on SOPs and "rfb" is generalized refactoring based on BDDs. Commands ending with a "z" stands for "accept zero gain results". By default all available types of resub are tried, with maximum number of candidates equal to 100. Faster versions of this script only look for a subset of resub types, e.g., nresub=3 for "rs" and "mf" commands. All commands can be programmed to work either on unmapped, e.g., AIG, or mapped logic networks. The Boolean resynthesis script produces improved results when iterated multiple times, e.g., two to five times, depending on the specific runtime budget. More iterations need more diverse optimization methods to be intertwined with Boolean resynthesis, to escape deeper local minima.

Example Results

We implemented Boolean resynthesis as part of a design automation solution. In the EDA flow, Boolean resynthesis runs after the initial logic structuring, which mainly aims at reducing area. So, Boolean resynthesis targets size reduction in the logic network. Tight control on the number of levels and the number of nets is enforced during Boolean resynthesis because this is known to correlate with delay and congestion later on in the flow. We also implemented Boolean resynthesis as a standalone optimization package, to run tests on academic benchmarks.

The EPFL benchmark suite project keeps track of the best synthesis results, mapped into LUT-6, generated by EDA research groups. Previous best results for the EPFL suite are held by UC Berkeley, EPFL, Synopsys Inc. and Cornell research groups. As the EPFL best results come mapped into LUT-6, we used Boolean resynthesis in mapped mode to improve on top of them. New gates introduced by Boolean resynthesis have less than 6 inputs, so the output of our Boolean resynthesis is already compliant to the EPFL competition rules. In order to form meaningful windows out of large-fanin nodes, we increased the cut size of the Boolean resynthesis script, adding+6 to the cut size of each command. The runtime of Boolean resynthesis still remained comparable to traditional restructuring/mapping scripts for the largest benchmarks processed. Our results are summarized in Table I. Thanks to Boolean resynthesis, we improved 8 of the previous best size (area) results. Level count improved for the hypotenuse benchmark, as highlighted in green color. For the other benchmarks, level count did not increase.

TABLE 1

NEW BEST AREA RESULTS FOR THE EPFL SUITE

| Benchmark | I/O | LUT-6 count | Level Count. |
|---|---|---|---|
| arbiter | 756/129 | 403 | 23 |
| i2c | 147/142 | 211 | 7 |
| log2 | 32/32 | 6570 | 119 |
| mem_ctrl | 1204/1231 | 2117 | 22 |
| priority | 128/8 | 108 | 26 |
| sin | 74/75 | 1228 | 55 |
| hypotenuse | 256/128 | 40385 | 4527 |
| voter | 1001/1 | 1297 | 17 |

We tested our EDA flow, empowered with Boolean resynthesis, on 50 state-of-the-art ASICs, coming from major electronics vendors. Embodiments described herein showed improvement w.r.t. a baseline flow without our Boolean resynthesis techniques. The post place & route results are summarized by Table II.

TABLE II

POST PLACE & ROUTE RESULTS ON 50 INDUSTRIAL DESIGN

| Flow | Area | Leakage | WNS | TNS | Runtime |
|---|---|---|---|---|---|
| Baseline | 1 | 1 | 1 | 1 | 1 |
| Proposed flow | −2.67% | −2.11% | −0.44% | −5.48% | +1.35% |

To summarize, a complete design flow, that includes embedded Boolean resynthesis, enables sensible area & leakage reductions, 2.67% and 2.11% respectively, on average, and also good WNS/TNS improvements, at only +1.35% runtime cost. To fully appreciate the impact of our techniques, consider that the relative area reduction is calculated on the whole chip. This also includes sequential elements, IPs and other blocks where Boolean resynthesis does not directly operate.

IC Design System

Figure 8:
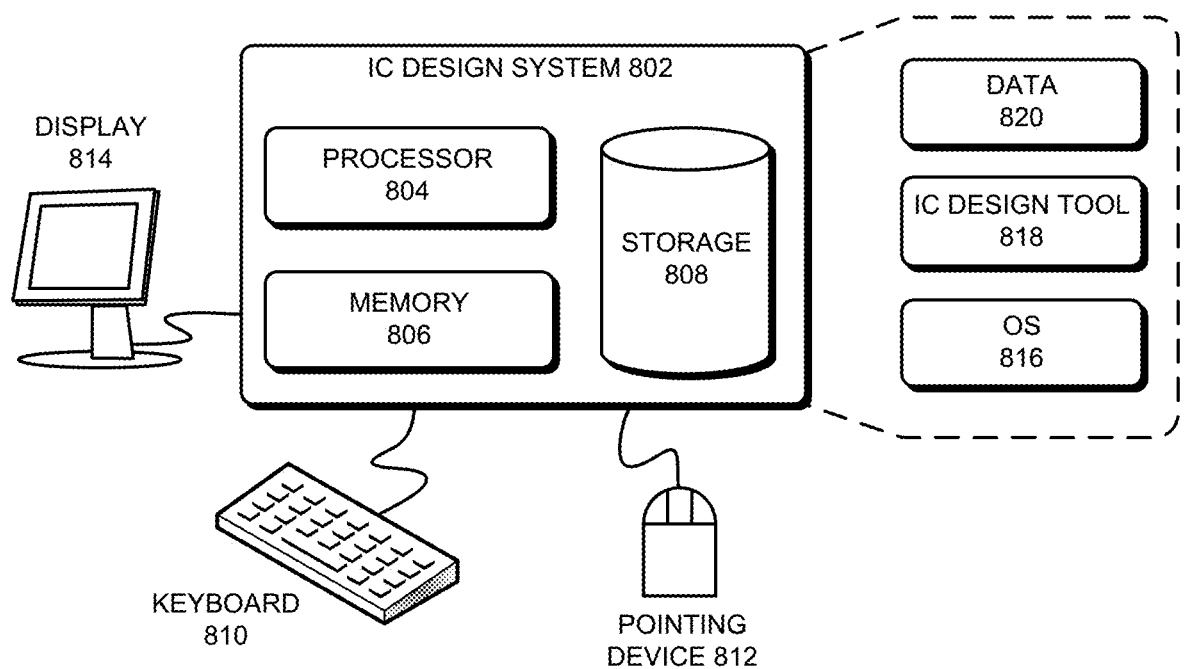
FIG. 8 illustrates an IC design system in accordance with some embodiments described herein.

The term "IC design system" generally refers to a hardware-based system that facilitates the design and manufacture of ICs. FIG. 8 illustrates an IC design system in accordance with some embodiments described herein. IC design system 802 can include processor 804, memory 806, and storage device 808. Specifically, memory locations in memory 806 can be addressable by processor 804, thereby enabling processor 804 to access (e.g., via load/store instructions) and manipulate (e.g., via logical/floating point/arithmetic instructions) the data stored in memory 806. IC design system 802 can be coupled to display device 814, keyboard 810, and pointing device 812. Storage device 808 can store operating system 816, IC design tool 818, and data 820. Data 820 can include input required by IC design tool 818 and/or output generated by IC design tool 818.

IC design system 802 may automatically (or with user help) perform one or more operations that are implicitly or explicitly described in this disclosure. Specifically, IC design system 802 can load IC design tool 818 into memory 806, and IC design tool 818 can then be used to produce a synthesized IC design, wherein the IC design tool 818 can perform Boolean resynthesis while producing the synthesized IC design. When the synthesized IC design is manufactured, the resulting IC chips contain the synthesized IC design which was optimized using Boolean resynthesis techniques and systems described herein.

The above description is presented to enable any person skilled in the art to make and use the embodiments. Various modifications to the disclosed embodiments will be readily apparent to those skilled in the art, and the general principles defined herein are applicable to other embodiments and applications without departing from the spirit and scope of the present disclosure. Thus, the present invention is not limited to the embodiments shown, but is to be accorded the widest scope consistent with the principles and features disclosed herein.

The data structures and code described in this disclosure can be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described in this disclosure include, but are not limited to, application-specific integrated circuits (ASICs), field-programmable gate arrays (FPGAs), dedicated or shared processors, and/or other hardware modules or apparatuses now known or later developed.

The methods and processes described in this disclosure can be partially or fully embodied as code and/or data stored in a computer-readable storage medium or device, so that when a computer system reads and executes the code and/or data, the computer system performs the associated methods and processes. The methods and processes can also be partially or fully embodied in hardware modules or apparatuses, so that when the hardware modules or apparatuses are activated, they perform the associated methods and processes. Note that the methods and processes can be embodied using a combination of code, data, and hardware modules or apparatuses.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A non-transitory computer-readable storage medium storing instructions that, when executed by a computer, cause the computer to perform operations for optimizing a logic network in an integrated circuit (IC) design by using Boolean resynthesis, the operations comprising:
   sorting nodes of the logic network in topological order to obtain a sorted list of nodes;
   for each node in the sorted list of nodes that is a root of a maximum fanout-free cone,
      determining a reconvergent cut based on the node,
      expanding the reconvergent cut to obtain a window of the logic network by adding one or more nodes that are (1) external to the reconvergent cut and (2) have fanins inside the reconvergent cut,
      determining a metric that indicates how beneficial resubstitution is expected to be on the window,
      comparing the metric with a threshold, and
      in response to determining that the window is expected to benefit from resubstitution, (1) computing truth-tables for the window, and (2) for each node in the window, applying a resubstitution flow; and
   providing the IC design to a next step in an IC design and manufacturing flow.

2. The non-transitory computer-readable storage medium of claim 1, wherein determining the metric that indicates how beneficial resubstitution is expected to be on the window comprises dividing a volume of the window by an input size of the window.

3. The non-transitory computer-readable storage medium of claim 1, wherein in response to determining that the window is expected to benefit from resubstitution, the operations further comprising updating the truth-tables using forward functional flexibility (FFF) values.

4. An apparatus, comprising:
   a processor; and
   a non-transitory computer-readable storage medium storing instructions that, when executed by the processor, cause the apparatus to perform operations for optimizing a logic network in an integrated circuit (IC) design by using Boolean resynthesis, the operations comprising:
      sorting nodes of the logic network in topological order to obtain a sorted list of nodes;
      for each node in the sorted list of nodes that is a root of a maximum fanout-free cone,
         determining a reconvergent cut based on the node,
         expanding the reconvergent cut to obtain a window of the logic network by adding one or more nodes that are (1) external to the reconvergent cut and (2) have fanins inside the reconvergent cut,
         determining a metric that indicates how beneficial resubstitution is expected to be on the window,
         comparing the metric with a threshold, and
         in response to determining that the window is expected to benefit from resubstitution, (1) computing truth-tables for the window, and (2) for each node in the window, applying a resubstitution flow; and
      providing the IC design to a next step in an IC design and manufacturing flow.

5. The apparatus of claim 4, wherein determining the metric that indicates how beneficial resubstitution is expected to be on the window comprises dividing a volume of the window by an input size of the window.

6. The apparatus of claim 4, wherein in response to determining that the window is expected to benefit from resubstitution, the operations further comprising updating the truth-tables using forward functional flexibility (FFF) values.

7. A method for optimizing a logic network in an integrated circuit (IC) design by using Boolean resynthesis, the method comprising:

sorting, by using a computer, nodes of the logic network in topological order to obtain a sorted list of nodes;

for each node in the sorted list of nodes that is a root of a maximum fanout-free cone, determining a reconvergent cut based on the node, expanding the reconvergent cut to obtain a window of the logic network by adding one or more nodes that are (1) external to the reconvergent cut and (2) have fanins inside the reconvergent cut, determining a metric that indicates how beneficial resubstitution is expected to be on the window, comparing the metric with a threshold, and in response to determining that the window is expected to benefit from resubstitution, (1) computing truth-tables for the window, and (2) for each node in the window, applying a resubstitution flow; and providing the IC design to a next step in an IC design and manufacturing flow.

8. The method of claim 7, wherein determining the metric that indicates how beneficial resubstitution is expected to be on the window comprises dividing a volume of the window by an input size of the window.

9. The method of claim 7, wherein in response to determining that the window is expected to benefit from resubstitution, the method further comprises updating the truth-tables using forward functional flexibility (FFF) values.

\* \* \* \* \*